United States Patent
Rodionov et al.

(10) Patent No.: US 10,848,137 B1
(45) Date of Patent: Nov. 24, 2020

(54) SYMMETRICAL BALANCED C-ELEMENT

(71) Applicants: ATI Technologies ULC, Markham (CA); Advanced Micro Devices, Inc., Santa Clara, CA (US)

(72) Inventors: Mikhail Rodionov, Richmond Hill (CA); Stephen Victor Kosonocky, Fort Collins, CO (US); Joyce Cheuk Wai Wong, Toronto (CA)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/406,990

(22) Filed: May 8, 2019

(51) Int. Cl.
*H03K 5/14* (2014.01)
*H03L 7/099* (2006.01)
*H03K 5/00* (2006.01)

(52) U.S. Cl.
CPC ............... *H03K 5/14* (2013.01); *H03L 7/099* (2013.01); *H03K 2005/00058* (2013.01)

(58) Field of Classification Search
CPC . H03L 7/099; H03K 5/14; H03K 2005/00058
USPC .................................. 327/291, 292
See application file for complete search history.

(56) References Cited

U.S. PATENT DOCUMENTS

| | | | |
|---|---|---|---|
| 6,806,750 B1 | 10/2004 | Rasmussen et al. | |
| 6,928,128 B1 | 8/2005 | Sidiropoulos | |
| 8,604,852 B1 * | 12/2013 | Turullols | H03L 7/07 327/159 |
| 9,954,540 B1 * | 4/2018 | YangGong | H03L 7/0995 |
| 2003/0112038 A1 | 6/2003 | Naffziger et al. | |
| 2004/0183613 A1 | 9/2004 | Kurd et al. | |
| 2006/0170471 A1 | 8/2006 | Haerle et al. | |
| 2008/0238509 A1 * | 10/2008 | Fairbanks | H03K 5/1565 327/175 |
| 2010/0194456 A1 | 8/2010 | Chai Kang et al. | |
| 2011/0063003 A1 | 3/2011 | Friedman et al. | |
| 2012/0176156 A1 | 7/2012 | Chang et al. | |
| 2012/0268168 A1 * | 10/2012 | Zid | G06F 1/04 326/93 |
| 2013/0249611 A1 | 9/2013 | Vandepas et al. | |

(Continued)

OTHER PUBLICATIONS

Yifan Yangong et al.; "Asymmetric Frequency Locked Loop (AFLL) for Adaptive Clock Generation in a 28nm SPARC M6 Processor"; IEEE Asian Solid-Slate Circuits Conference; pp. 373-376; Nov. 10-12, 2014; KaoHsiung, Taiwan; 4 pages.

*Primary Examiner* — William Hernandez
(74) *Attorney, Agent, or Firm* — Polansky & Associates, P.L.L.C.; Paul J. Polansky; Nathan H. Calvert

(57) ABSTRACT

A C-element circuit for use in an oscillator or the like includes a first input terminal for receiving a first input signal, a second input terminal for receiving a second input signal, and an output latch for providing an output signal based on a relationship between the two input signals. A stack of input transistors is included with an outer pair of input transistors with gates connected to the first input terminal and an inner pair of input transistors with gates connected to a second input terminal. A balancing circuit operates to equalize a first delay of a change in the first input signal affecting the output signal with a second delay of a change in the second input signal affecting the output signal. Bypass control techniques are provided for using the C-element circuit with a single input.

19 Claims, 6 Drawing Sheets

(56) References Cited

U.S. PATENT DOCUMENTS

| | | |
|---|---|---|
| 2015/0244354 A1 | 8/2015 | Parikh |
| 2016/0149563 A1 | 5/2016 | Kim et al. |
| 2018/0183413 A1* | 6/2018 | Wong .................. H03K 5/1506 |
| 2019/0199363 A1* | 6/2019 | Kosonocky ............... H03L 1/00 |
| 2019/0229736 A1* | 7/2019 | Kosonocky ............. H03K 5/14 |

* cited by examiner

SYMMETRICAL BALANCED C-ELEMENT

BACKGROUND

A clock generator circuit needs to supply a clock signal that is stable to sequential components of an integrated circuit in order for the integrated circuit components to function correctly in accordance with their design. Clock generator circuits typically include an oscillator that produces a signal of a desired frequency. The ability of a clock generator circuit to supply a stable input or system clock signal to an integrated circuit system may be affected by noise on the power supply line. Noise may cause the power supply voltage to fall below, or "droop" below, a desired reference voltage level. Or, noise may cause the power supply voltage to rise above or overshoot the desired reference voltage level. Noise on the power supply line may also result in fluctuations or jitter on a system clock signal line that affects the stability and operation of the sequential components of an integrated circuit.

Adaptive oscillator circuits such as Digitally Controlled Oscillators (DCO) or clock stretching Digital Frequency Lock Loops (DFLL) are used to compensate for noise on the power supply line. Such DCO or DFLL typically include an edge detector which produces the clock signal as an output. A Muller C-element is a type of edge detector circuit frequently used in DCOs and DFLLs. However, Muller C-elements do not provide symmetrical signal path from both input signals to the output, which may result in timing and performance problems when used in certain adaptive oscillators.

Figure 1:
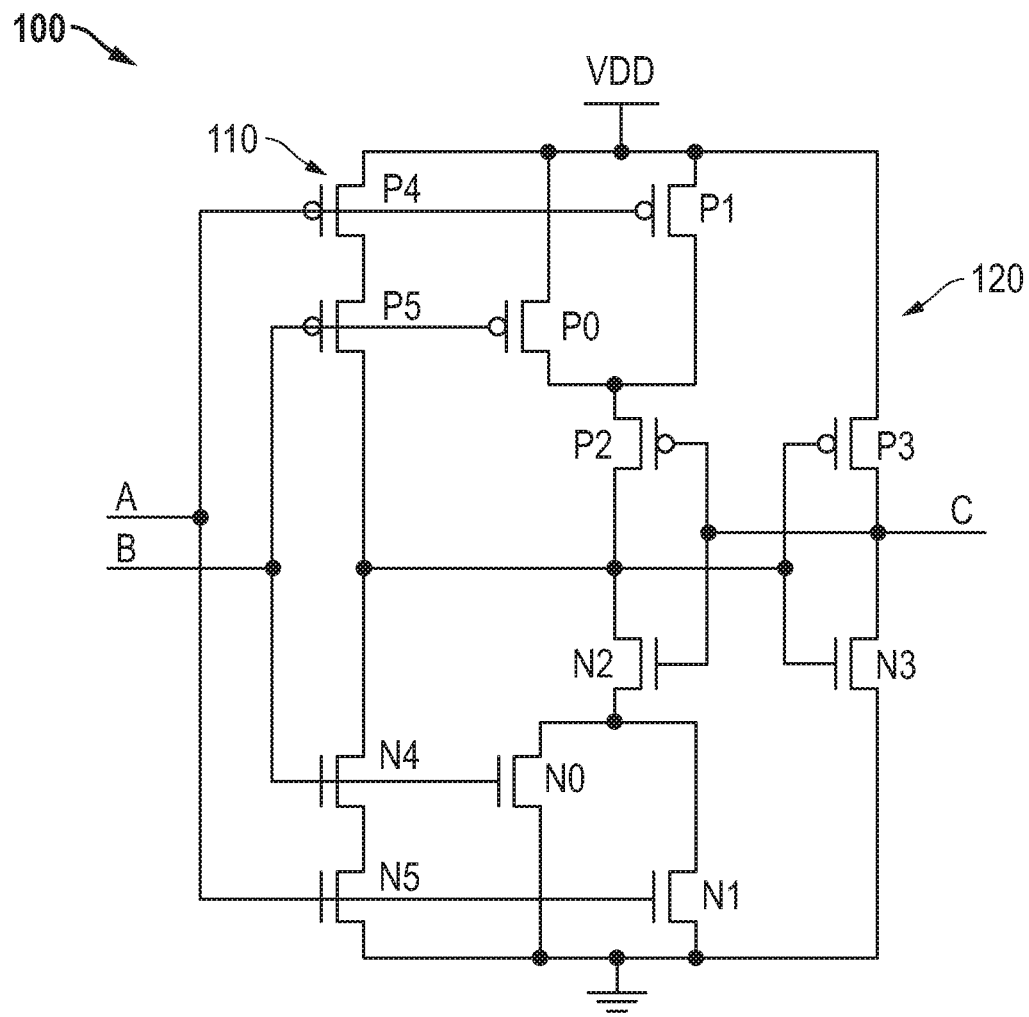
FIG. 1 shows in circuit diagram form a Muller C-element according to an example prior art design.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A C-element circuit for use in an oscillator or the like includes a stack of input transistors, a balancing circuit, and an output latch. A first input terminal receives a first input signal, a second input terminal receives a second input signal, and an output latch provides an output signal based on a relationship between the first input signal and the second input signal. The stack of input transistors has an outer pair of input transistors with gates coupled to the first input terminal and an inner pair of input transistors with gates connected to a second input terminal. The balancing circuit is connected to the first and second input terminals and the output latch, and operable to equalize a first delay of a change in the first input signal affecting the output signal with a second delay of a change in the second input signal affecting the output signal.

An oscillator circuit includes a first delay line, a second delay line, and a C-element circuit. The first delay line has a signal input, a supply input for receiving a first voltage, and an output that transmits a first delayed signal at a first delay proportional to the first voltage. The second delay line has a signal input, a supply input for receiving a second voltage, and an output that transmits a second delayed signal at a second delay proportional to the second voltage. The C-element circuit includes a stack of input transistors, a balancing circuit, and an output latch. A first input terminal receives a first input signal, a second input terminal receives a second input signal, and an output latch provides an output signal based on a relationship between the first input signal and the second input signal. The stack of input transistors has an outer pair of input transistors with gates coupled to the first input terminal and an inner pair of input transistors with gates connected to a second input terminal. The balancing circuit is connected to the first and second input terminals and the output latch, and operable to equalize a first delay of a change in the first input signal affecting the output signal with a second delay of a change in the second input signal affecting the output signal.

A method is for use in clock frequency adjustment of an oscillator circuit. The method includes coupling a first delay line to a regulated supply voltage and causing the first delay line to transmit a first delayed signal at a first delay proportional to the regulated supply voltage. The method also includes coupling a second delay line to a droopy supply voltage and causing the second delay line to transmit a second delayed signal at a second delay proportional to the droopy supply voltage. The first delayed signal and the second delayed signal are input to first and second input terminals of a C-element circuit. The method generates an output clock at an output latch of the C-element circuit, the output clock having an oscillation frequency based on a relationship between the regulated supply voltage and the droopy supply voltage. The output clock is fed as an input to the first and second delay lines. The method includes equalizing a response time of the C-element circuit to generate an output clock toggle based on a change in the first delayed signal to that based on a change in the second delayed signal.

FIG. 1 shows in circuit diagram form a Muller C-element 100 according to an example prior art design. A Muller C-element, or concurrence element, is a form of edge detector circuit that detects when the last of two or more events has occurred. In a typical C-element, the output goes to a logical high when all the inputs have a logical high, and then stays at a logical high until all of the inputs are at a logical low.

Generally Muller C-element circuit 100 has two input terminals, A and B, with a stack of input transistors 110 having an outer pair of input transistors P4 and N5 with gates coupled to the input terminal A and an inner pair of input transistors P5 and N4 with gates coupled to input terminal B. The central node of the stack of input transistors is connected to the central node of an output latch 120. Output latch 120 includes transistors P0, P1, P2, and P3, and transistors N0, N1, N2, and N3. Output latch 120 provides an output signal on an output terminal C based on the relationship set forth above between the first input signal on input terminal A and the second input signal on input terminal B.

C-elements are often used in adaptive oscillator circuits such as Digitally Controlled Oscillators (DCO) or clock stretching Digital Frequency Lock Loops (DFLL). A classical C-Element circuit such as that shown does not provide symmetrical signal path for both input signals to the output. The input transistors P4, P5, N4, N5, driven by signals A and B, have different operating conditions, causing unbalanced or mismatched delays from the input A to the output C and from the input B to the output C resulting in a built-in timing offset or a timing error. In adaptive clocking, such a delay imbalance is a critical issue which can cause frequency overshoot under conditions of a power supply voltage overshoot in a power supply di/dt event. Such frequency overshoot can cause timing violations in the synchronous circuits driven by a DFLL clock.

Figure 2:
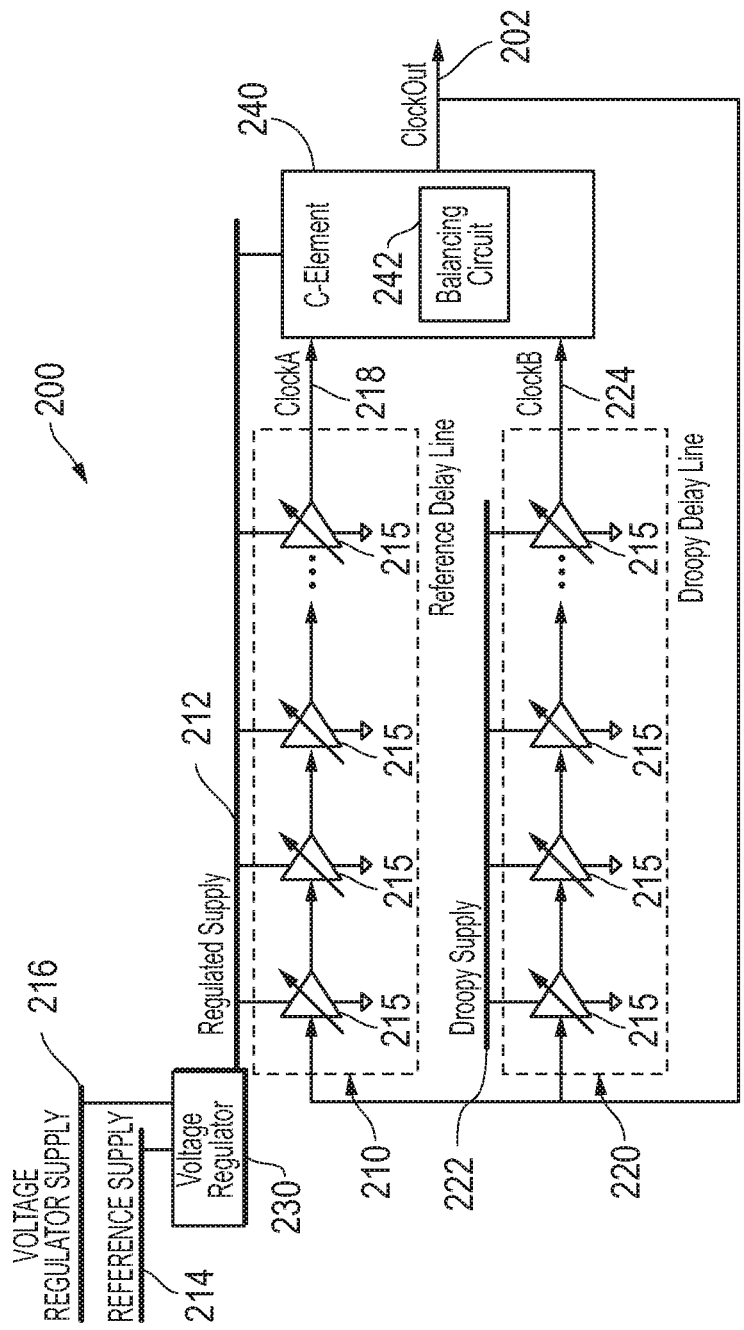
FIG. 2 shows in block diagram form an oscillator circuit according to some embodiments.

FIG. 2 shows in block diagram form an oscillator circuit 200 according to some embodiments. Generally, the oscillator circuit 200 of this embodiment may be used in a clock generator system or other suitable adaptive oscillator systems or in DCO or DFLL systems. Oscillator circuit 200 includes a reference delay line 210, a droopy delay line 220, a voltage regulator 230, and a C-element 240. Reference delay line 210 includes a series of adjustable delay elements 215, including a first adjustable delay element 215 having an input, a control input, and an output, a second adjustable delay element 215 having an input connected to an output of the first delay element, a control input, and an output, and so on until a last adjustable delay element 215 having an input connected to an output of a preceding adjustable delay element 215, a control input, and an output for providing an output of reference delay line 210. Droopy delay line 220 is constructed similarly to reference delay line 210.

Different power supplies are provided to delay lines 210 and 220, which causes different delay performance. Reference delay line 210 is supplied by regulated supply 212, which is generated by voltage regulator 230. Regulated supply 212 provides a constant or steady voltage, within acceptable or nominal limits. The acceptable or nominal limits are based on a reference supply 214 that may be generated on chip or off-chip, and is set to a certain level that may be higher or lower than the core power supply voltage. Another input to the voltage regulator 230 is the voltage regulator supply 216 which is the operational power supply of voltage regulator 230. In some embodiments, the voltage regulator 230 may include a filter, such as, without limitation, a low-pass filter, to smooth out any noise transients of the reference supply 214 to better produce the regulated supply 212. In one embodiment, the reference supply 214 may be the core power supply. In another embodiment, the core power supply may also correspond to the "droopy" voltage supply 222.

In some embodiments, the reference supply 214 has minimal noise or variation and may be directly connected to the reference delay line 210, instead of the regulated supply 212 produced by voltage regulator 230. The regulated supply 212 provides a comparison or reference point to determine how far outside the target power supply voltage the droopy supply 222 may swing based on the noise. The target power supply voltage is the desired standard operating voltage of the host system or circuit, excluding any variations or fluctuations.

Droopy delay line 220 is supplied by droopy supply 222. Droopy supply 222 is the power supply for which the clock out is adaptively adjusted by oscillator circuit 200, and is subject to noise and "drooping", or dips in voltage due to di/dt events. Droopy supply may be the input or core power supply that supplies the operating voltage for all the components on a system-on-chip.

Reference delay line 210 provides a delayed signal, ClockA 218, as one input to C-element 240. The droopy delay line 220 provides a delayed signal, ClockB 224, as another input to C-element 240. In operation, the adjustable delay elements 215 of droopy delay line 220 will often have different delays than those of reference delay line 210. Based on the two inputs, C-element 240 generates an output clock, ClockOut 202. ClockOut 202 is also fed to the inputs of both reference delay line 210 and droopy delay line 220. Changes in polarity may also be implemented inside reference delay line 210 and the droopy delay line 220.

C-element 240 toggles its output ClockOut 202 only when both of its inputs are of the same polarity. For example, when both ClockA 218 and ClockB 224 are at the same polarity of logic zero "0" or logic one "1", the output ClockOut 202 toggles or changes polarity. A change in polarity is said to occur when a signal changes from a first defined state to a different second defined state, for example, from 0 to 1. C-element 240 is Muller C-element including an additional balancing circuit 242, which serves to equalize the circuits delay or response time in responding to changes of the two inputs. That is, balancing circuit 242 acts to equalize the delay of a change in the ClockA 218 signal affecting the output signal with the delay of a change in the ClockB 224 signal affecting the output signal. Example implementations of such a balancing circuit are discussed further below.

Figure 3:
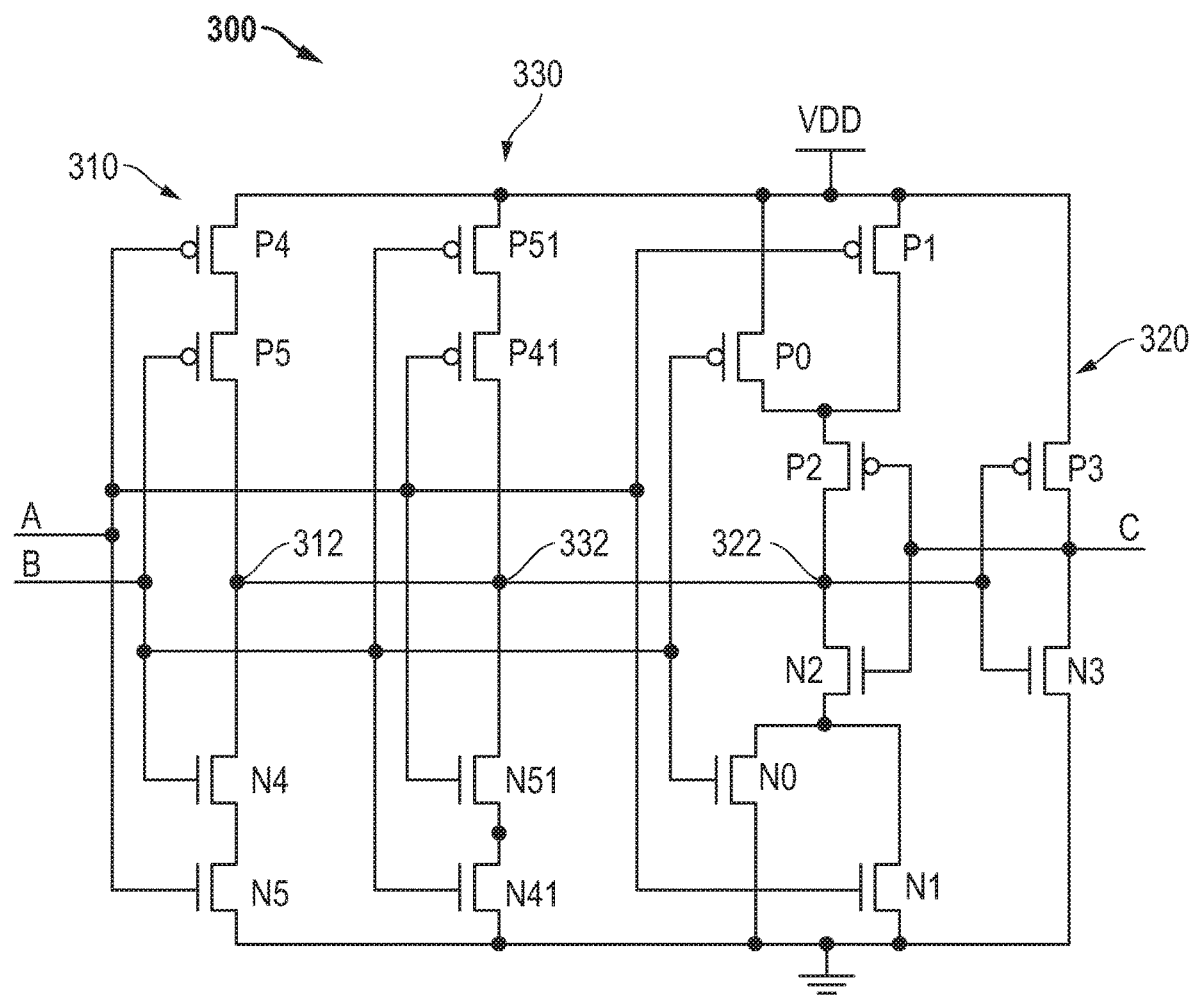
FIG. 3 shows in circuit diagram form a C-element including a balancing circuit according to some embodiments.

FIG. 3 shows in circuit diagram form a C-element 300 including a balancing circuit 330 according to some embodiments. Generally, C-element 300 is for use in an oscillator or the like, such as the oscillator circuit of FIG. 2, and includes a stack of input transistors 310, a balancing circuit 330, and an output latch 320. The stack of input transistors 310 includes a first input terminal A for receiving a first input signal, and a second input terminal B for receiving a second input signal. Output latch 320 provides an output signal on output terminal C based on a relationship between the first input signal and the second input signal.

The stack of input transistors 310 includes transistors P4, P5, N4, and N5 connected in series between the supply voltage and ground. Input terminals A and B connect to an outer pair of input transistors P4 and N5 having gates connected to input terminal A and an inner pair of input transistors P5 sand N4 with gates connected to input terminal B. The transistors are preferably implemented with CMOS (complementary metal oxide semiconductor) technology including PMOS (P-channel metal oxide semiconductor) transistors whose labels include 'P' and NMOS (N-channel metal oxide semiconductor) transistors whose labels include 'N'.

Balancing circuit 330 generally is connected to the first and second input terminals A and B and to the output latch, and operates to equalize a first delay of a change in the first input signal on input terminal A affecting the output signal on output terminal C with a second delay of a change in the second input signal on input terminal B affecting the output signal. More specifically, balancing circuit 330 includes a stack of transistors connected between the supply voltage and ground, with an outer pair of transistors P51 and N41 having gates connected to the second input terminal B and an inner pair of transistors P41 and N51 having gates connected to the first input terminal A. The central node 312 of the stack of input transistors 310 is connected to a central node 332 of balancing circuit 330. Central node 332 is connected to a central node 322 of the output latch 320.

Input terminal A is also connected to gates of a first pair of latch input transistors P1 and N1. Similarly, input terminal B is also connected to gates of a second pair of latch input transistors, P0 and N0. Transistors P0 and P1 have their source terminals connected the supply voltage and their drain terminals connected to the source terminal of latch transistor P2. Transistors N0 and N1 have their source terminals connected to ground or the supply negative rail, and their drain terminals connected to latch transistor N2. Latch transistor P2 has its drain terminal connected to central node 322, which is connected to the drain of latch transistor N2. Central node 322 is connected in feed-forward fashion to the gates of latch output transistors P3 and N3. Output transistors P3 and N3 are connected in series between the supply voltage and ground, and have output terminal C connected to their central node. The latch output at output terminal C is also connected back to the gates of latch transistors P2 and N2, completing the latch feedback connection.

In operation, balancing circuit 330 serves to provide a symmetrical signal path for either input A or B to affect the latch central node 322. For example, if input A is ON and the C-element is ready to toggle when input B is ON, input transistor P5, with its gate connected to input B, may have slightly different bias conditions and switching delay than input transistor P4 has with its gate connected to input A. Balancing circuit 330 provides a path for input signal B to pull up central node 332 with the same delay and bias conditions that input signal A has when pulling up node 312. A similar path is provided for each toggling state of C-element 300. Such paths serve to make the timing performance of C-element 300 symmetrical in response to either input.

Figure 4:
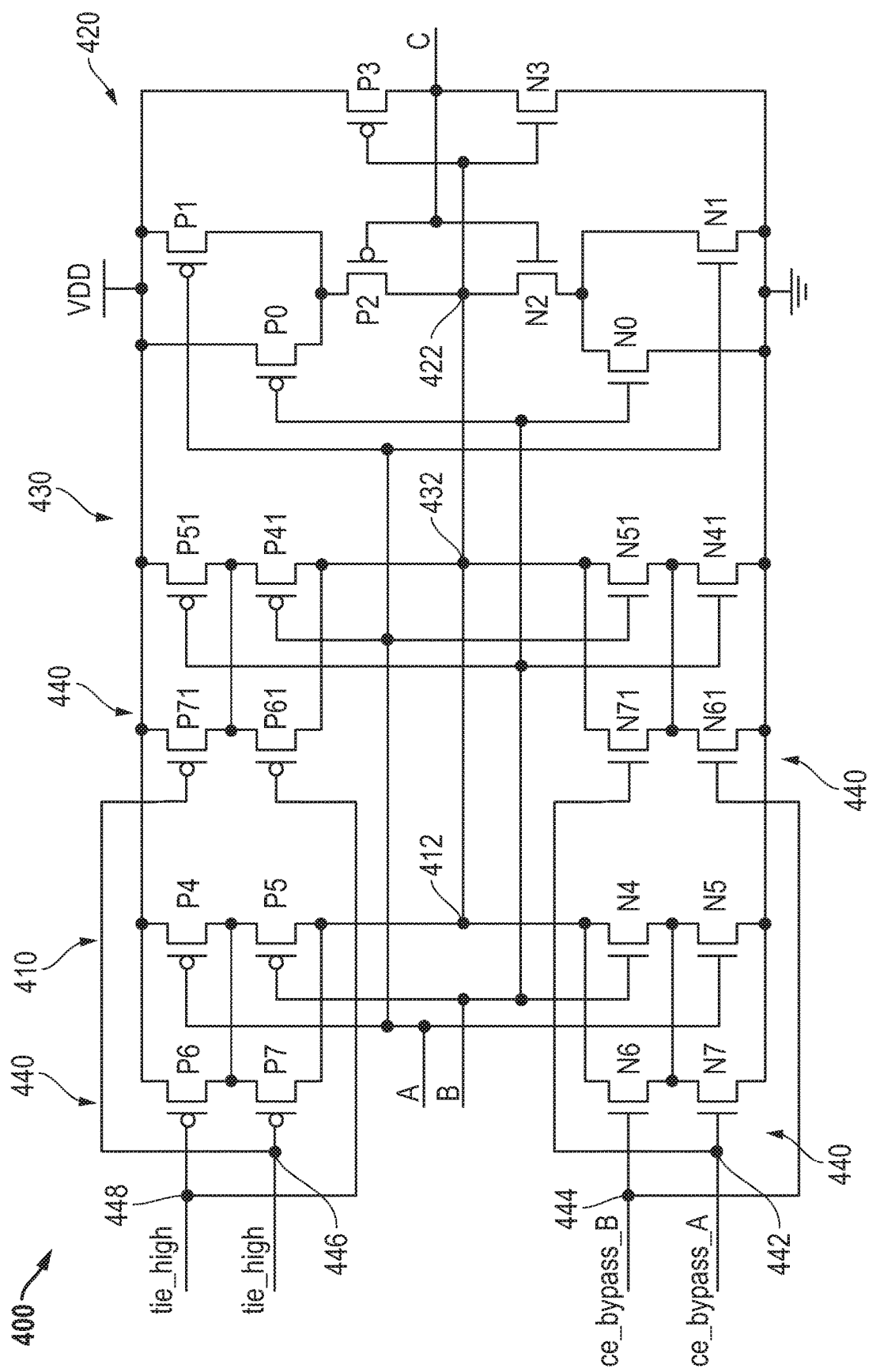
FIG. 4 shows in circuit diagram form a C-element including a balancing circuit and a bypass control capability according to some embodiments.
Figure 5:
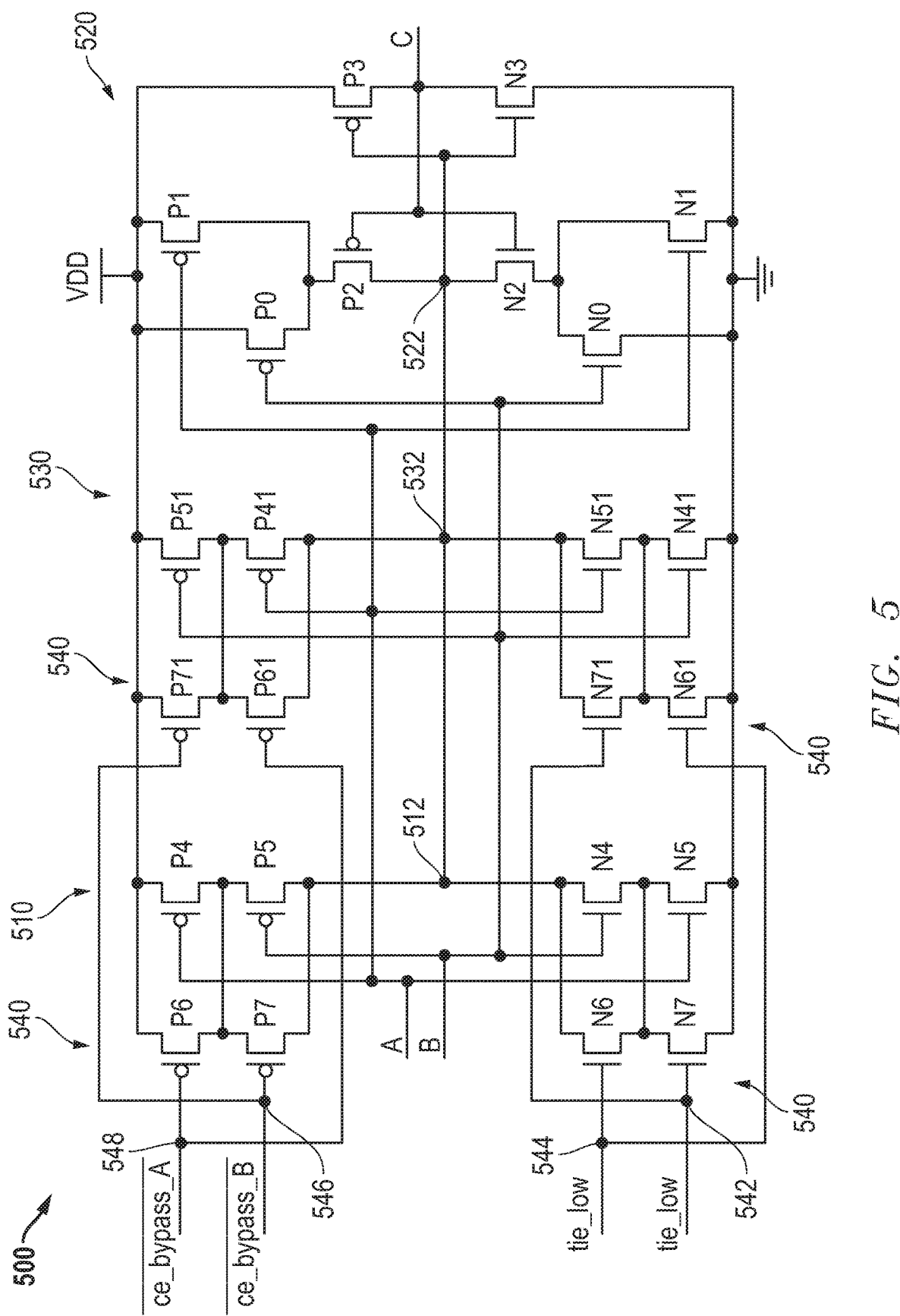
FIG. 5 shows in circuit diagram form another C-element including a balancing circuit and bypass control capability according to some embodiments.

FIG. 4 shows in circuit diagram form a C-element 400 including a balancing circuit 430 and a bypass control capability according to some embodiments. C-element 400 includes the circuitry described above with respect to C-element 300, with the transistor labels the same as their equivalent transistors in FIG. 3 for ease of reference. Generally, C-element 400 is also used in an oscillator circuit or the like, and includes a stack of input transistors 410, a balancing circuit 430, a bypass control portion 440, and an output latch 420. The bypass control capability is provided by additional transistors P6, P7, N6, N7, P71, P61, N71, and N61 and their connection into C-element 400. The bypass control capability is used in testing or special modes to enable C-element 400 to produce a clock output at terminal C based on only one input. One of the delay lines 210 or 220 (FIG. 2) is deactivated in such a scenario. The bypass control capability may also be employed in various operating scenarios where only one input is used to the C-element. In some DCO circuits, the delay lines, when deactivated, produce an output (the signal at input terminal A or input terminal B) that rests at a low logic level. The bypass control capability depicted in FIG. 4 is for use with such delay lines. The design FIG. 5 is for use with delay lines that produce a high output level when they are deactivated.

Elements connected similarly to those in FIG. 3 are the stack of input transistors 410, the balancing circuit 430, and the output latch 420. As depicted, the stack of input transistors 410 includes transistors P4, P5, N4, and N5, with central node 412. The balancing circuit 430 includes a stack of transistors P51, P41, N51, and N41 with a central node 432. The output latch 420 includes transistors P0, P1, P2, P3, N0, N1, N2, and N3 with a central node 422. When C-element 400 is used in an oscillator circuit like that of FIG. 2, input terminals A and B receive first and second input signals, which come from delay lines receive the C-element output as an input.

The bypass control portion is generally labeled 440 and includes a first input bypass terminal 442 for receiving a first input bypass signal ce_bypass_A, a second input bypass terminal 444 for receiving a second input bypass signal ce_bypass_B. Bypass control portion 440 is connected to the first and second input bypass terminals, the stack of input transistors 410, and the balancing circuit 430 and operable to enable the output latch 420 to toggle the output signal based on only one of the first and second input signals if a respective one of the first and second bypass input signals is activated. The first input bypass signal ce_bypass_A is set high for operation when input A is held low and only input B is used. The second input bypass signal ce_bypass_B is set high when input B is low and only input A is used.

First input bypass terminal 442 is connected to the gates of transistors N7 and N71. In operation, when switched ON, transistor N7 pulls down the node between transistors N4 and N5, bypassing transistor N5. Transistor N71 when switched ON bypasses transistor N51, connecting the central node 432 of balancing circuit 430 to the drain of transistor N41. Second input bypass terminal 444 is connected to the gates of transistors N6 and N61. Transistor N6 when switched ON bypasses transistor N4 to connect the central node the stack of input transistor 410 to the drain of transistor N5. Transistor N61 when switched ON bypasses transistor N41 to pull down the source of transistor N51 to ground.

Bypass control portion 440 also receives two "tie_high" signals at input terminals 446 and 448, which are kept at a high state during operation and may be "tied" high or permanently connected to VDD. Input terminal 446 is connected to the gates of transistors P7 and P71. Input terminal 448 is connected to the gates of transistors P6 and P61. Transistors P6, P7, P61 and P71 are essentially "dummy" or unused transistors, whose gate input signals remain activated in a high state during operation, keeping transistors OFF. The function of these transistors is to balance the loading conditions across the pull-up and pull-down sides of the circuit at central nodes 412 and 432, which are connected together. Such a balanced arrangement maintains the symmetrical delay performance of the C-element despite the addition of bypass portion 440. Various circuit are kept in balance by the presence of transistors P6, P7, P61 and P71.

FIG. 5 shows in circuit diagram form another C-element 500 including a balancing circuit and bypass control capability according to some embodiments. The depicted C-element 500 has the same elements as that of FIG. 4, but is employed with different signaling conditions to provide a bypass control capability for oscillator circuits in which a delay line output is held high when a delay line is deactivated.

Generally, the stack of input transistors 510 including transistors P4, P5, N4, and N5, with central node 512. A balancing circuit 530 includes a stack of transistors P51, P41, N51, and N41 with a central node 532. An output latch 520 includes transistors P0, P1, P2, P3, N0, N1, N2, and N3 with a central node 522. First and second input signals are fed to input terminals A and B, respectively, from delay lines arranged like those of FIG. 2.

The bypass control portion is labeled 540 and includes a first input bypass terminal 548 for receiving a first input bypass signal ce_bypass_A NOT, a second input bypass terminal 546 for receiving a second input bypass signal ce_bypass_B NOT. Bypass control portion 540 is connected to the first and second input bypass terminals, the stack of input transistors 510, and the balancing circuit 530 and operable to enable the output latch 520 to toggle the output signal based on only one of the first and second input signals if a respective one of the first and second bypass input signals is activated. The input bypass signals are designated with a NOT to indicate they are active low. First input bypass signal ce_bypass_A NOT is set low when input A is held high and only input B is used. The second input bypass signal ce_bypass_B NOT is set low when input B is held high and only input A is used.

First input bypass terminal 548 is connected to the gates of transistors P6 and P61. In operation, when switched ON by the activation of first input bypass signal ce_bypass_A NOT, transistor P6 pulls up the node between transistors P4 and P5, bypassing transistor P5. Transistor P61 when switched ON bypasses transistor P41, connecting central node 532 of balancing circuit 530 to the drain of transistor P51.

Second input bypass terminal 546 is connected to the gates of transistors P7 and P71. Transistor P7 when switched ON by the activation of first input bypass signal ce_bypass_A NOT, bypasses transistor P5 to connect the central node the stack of input transistor 410 to the drain of transistor P4. Transistor P71 when switched ON bypasses transistor P51 to pull up the source of transistor P41 to VDD.

Transistors P6, P7, P61, and P71 are balanced by transistors N6, N7, N61, and N71 which make the loading conditions at nodes 512 and 532 symmetrical with respect to the pull-up and pull-down sides of the circuit, as discussed with respect to FIG. 4. In this embodiment, transistors N6, N7, N61, and N71 are controlled by two tie_low signals at bypass input terminals 542 and 544 which connect to the transistor gates. The tie_low signals are held low during operation, keeping transistors N6, N7, N61, and N71 in an OFF state.

Figure 6:
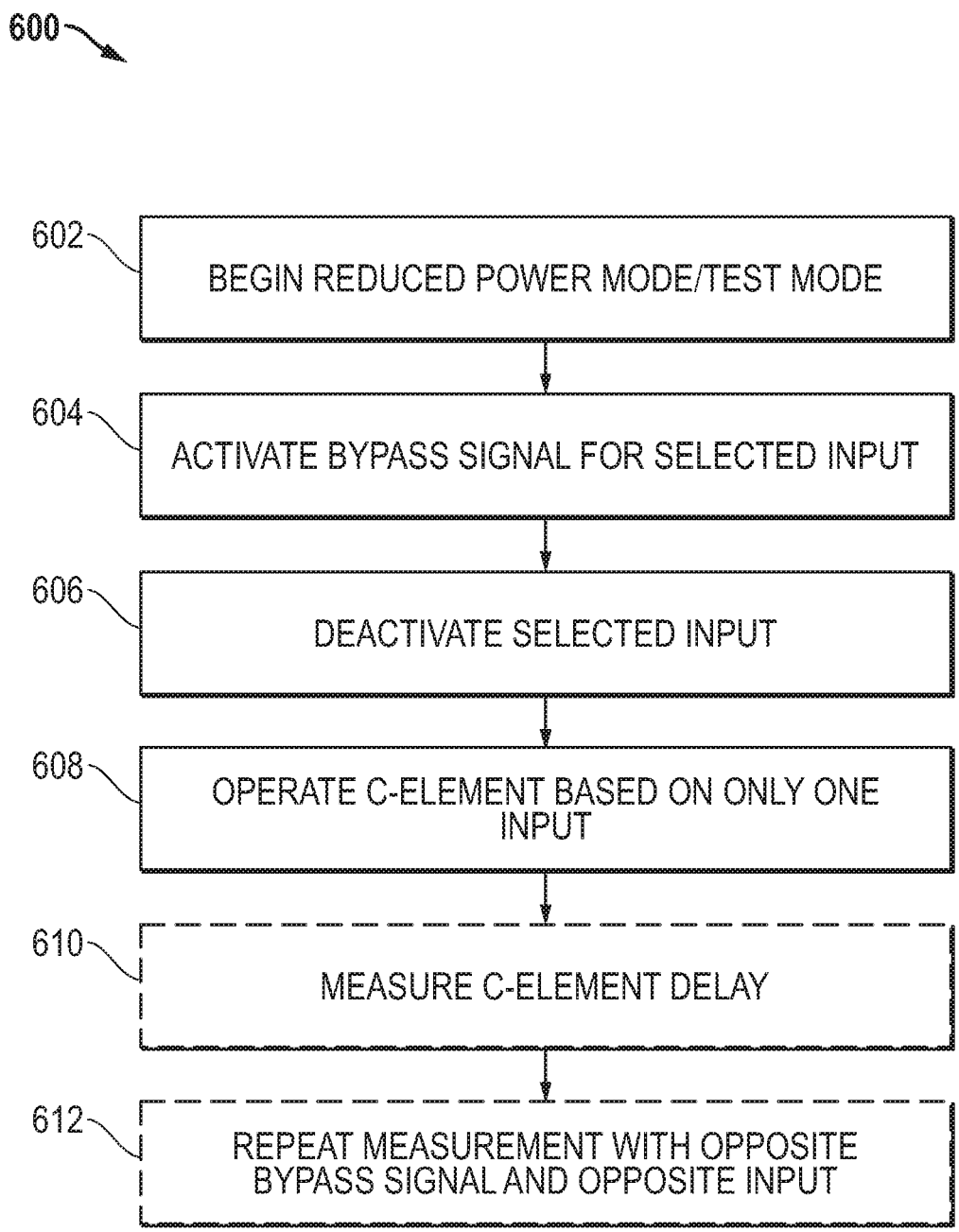
FIG. 6 shows in flow diagram form a process of operating a C-element according to some embodiments.

FIG. 6 shows in flow diagram form a process 600 of operating a C-element according to some embodiments. Process 600 is typically performed during testing of an oscillator circuit C-element with bypass control capability such as those in FIG. 4 or FIG. 5. Process 600 may also be performed to provide a special operating mode such as a low power mode in which only one of the C-element inputs is used, Process 600 typically employs inputs from testing logic or control logic arranged near the oscillator circuitry under test, and is controlled by firmware through setting designated register values, for example. Other techniques such as test probes may also be used.

Process 600 begins at block 602 where a test or special operating mode such as a reduced power mode is entered. At block 604, process 600 activates the input bypass signal for the input that is desired to be bypassed (A or B). At block 606, process 600 deactivates the input desired to be bypassed. As discussed above, a delay line is deactivated at one of the C-element inputs, which may result in the delay line output being held high or held low, depending on the delay line design. At block 608, process 600 operates the C-element based on only the remaining active input. If a low power mode or other special operating mode is desired, process 600 may not move on to blocks 610 and 612, and instead may simply operate the circuit in the configuration achieved at block 608. If testing is desired, process 600 then goes to block 610, where at least one measurement is taken of the C-element performance. As depicted, this block typically involves measuring the C-element delay, but may also include measuring other characteristics such as frequency versus various voltage conditions such as a droopy supply voltage. If desired, at block 612 the deactivated and activated inputs may be switched and the testing repeated operating the C-element based on the new active input.

Benefits, other advantages, and solutions to problems have been described above with regards to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

The circuits herein or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, other known designs for C-elements may be modified to include balancing circuits and bypass control circuits according to the techniques herein. While CMOS technology is used in this example, the techniques may be applied with C-elements built with other transistor technologies.

Accordingly, it is intended by the appended claims to cover all modifications of the disclosed embodiments that fall within the scope of the disclosed embodiments.

What is claimed is:

1. A C-element circuit for use in an oscillator or the like, comprising:
   a first input terminal for receiving a first input signal;
   a second input terminal for receiving a second input signal;
   an output latch for providing an output signal based on a relationship between the first input signal and the second input signal;
   a stack of input transistors having an outer pair of input transistors with gates coupled to the first input terminal and an inner pair of input transistors with gates coupled to the second input terminal; and a balancing circuit coupled to the first and second input terminals and the output latch, and operable to equalize a first delay of a change in the first input signal affecting the output signal with a second delay of a change in the second input signal affecting the output signal.

2. The C-element circuit of claim 1, wherein the balancing circuit comprises a stack of transistors including an outer pair of transistors having gates coupled to the second input terminal and an inner pair of transistors having gates coupled to the first input terminal.

3. The C-element circuit of claim 2, wherein the outer pair of transistors comprises a PMOS (P-channel metal oxide semiconductor) transistor and an NMOS (N-channel metal oxide semiconductor) transistor, and the inner pair of transistors comprises a PMOS transistor and an NMOS transistor.

4. The C-element circuit of claim 1, in which a central node of the stack of input transistors is coupled to a central node of the balancing circuit.

5. The C-element circuit of claim 1, in which a central node of the balancing circuit is coupled to a central node of the output latch.

6. The C-element circuit of claim 1, further comprising a bypass control portion including (i) a first input bypass terminal for receiving a first input bypass signal, (ii) a second input bypass terminal for receiving a second input bypass signal, (iii) bypass circuitry coupled to the first and second input bypass terminals, the stack of input transistors, and the balancing circuit and operable to enable the output latch to toggle the output signal based on only one of the first and second input signals if a respective one of the first and second bypass input signals is activated.

7. An oscillator circuit comprising:
a first delay line having a signal input, a supply input for receiving a first voltage, and an output that transmits a first delayed signal at a first delay proportional to the first voltage;
a second delay line having a signal input, a supply input for receiving a second voltage, and an output that transmits a second delayed signal at a second delay proportional to the second voltage; and
a C-element circuit comprising:
a first input terminal for receiving the first delayed signal;
a second input terminal for receiving the second delayed signal;
an output latch for providing an output clock based on a relationship between the first delayed signal and the second delayed signal, the output clock fed to the signal inputs of the first and second delay lines;
a stack of input transistors having an outer pair of input transistors with gates coupled to the first input terminal and an inner pair of input transistors with gates coupled to the second input terminal; and
a balancing circuit coupled to the first and second input terminals and the output latch, and operable to equalize a third delay of a change in the first delayed signal affecting the output clock with a fourth delay of a change in the second delayed signal affecting the output clock.

8. The oscillator circuit of claim 7, wherein the balancing circuit comprises a stack of transistors including an outer pair of transistors coupled to the second input terminal and an inner pair of transistors coupled to the first input terminal.

9. The oscillator circuit of claim 8, wherein the outer pair of transistors comprises a PMOS (P-channel metal oxide semiconductor) transistor and an NMOS (N-channel MOS) transistor, and the inner pair of transistors comprises a PMOS transistor and an NMOS transistor.

10. The oscillator circuit of claim 7, in which a central node of the stack of input transistors is coupled to a central node of the balancing circuit.

11. The oscillator circuit of claim 7, in which a central node of the balancing circuit is coupled to a central node of the output latch.

12. The oscillator circuit of claim 7, further comprising a bypass control portion including (i) a first input bypass terminal for receiving a first input bypass signal, (ii) a second input bypass terminal for receiving a second input bypass signal, (iii) bypass circuitry coupled to the first and second input bypass terminals, the stack of input transistors, and the balancing circuit and operable to enable the output latch to toggle the output clock based on only one of the first and second delayed signals if a respective one of the first and second bypass input signals is activated.

13. The oscillator circuit of claim 7, wherein the first voltage is a regulated supply voltage and the second voltage is a droopy supply voltage.

14. A method of clock frequency adjustment in an oscillator circuit comprising:
coupling a first delay line to a regulated supply voltage and causing the first delay line to transmit a first delayed signal at a first delay proportional to the regulated supply voltage;
coupling a second delay line to a droopy supply voltage and causing the second delay line to transmit a second delayed signal at a second delay proportional to the droopy supply voltage;
inputting the first delayed signal and the second delayed signal to first and second input terminals of a C-element circuit;
generating an output clock at an output latch of the C-element circuit, the output clock having an oscillation frequency based on a relationship between the regulated supply voltage and the droopy supply voltage;
feeding the output clock as an input to the first and second delay lines; and
equalizing a response time of the C-element circuit to generate an output clock toggle based on a change in the first delayed signal to that based on a change in the second delayed signal.

15. The method of claim 14, wherein equalizing the response time comprises feeding the first and second delayed signals to a balancing circuit coupled to the first and second input terminals and the output latch.

16. The method of claim 15, wherein equalizing the response time further comprises feeding a signal from a central node of the balancing circuit to a central node of the output latch of the C-element circuit.

17. The method of claim 15, wherein equalizing the response time further comprises feeding a signal from a central node of a stack of input transistors of the C-element circuit to a central node of the output latch of the C-element circuit.

18. The method of claim 14, further comprising causing the C-element circuit to alter its function to generate the output clock based on only one of the first or second delayed signals.

19. The method of claim 18, wherein causing the C-element circuit to alter its function includes selectively deactivating one of the first or second delayed signals, and causing the C-element circuit to generate the output clock based on a remaining one of the first or second delayed signals.

\* \* \* \* \*